(12) United States Patent
Kyeong et al.

(10) Patent No.: US 9,083,395 B2
(45) Date of Patent: Jul. 14, 2015

(54) MULTIPLE-MODE BROADBAND WIRELESS COMMUNICATION DEVICE AND METHOD

(75) Inventors: Mun Geon Kyeong, Daejeon (KR); Woo Yong Lee, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 57 days.

(21) Appl. No.: 13/519,001

(22) PCT Filed: Dec. 7, 2010

(86) PCT No.: PCT/KR2010/008714
§ 371 (c)(1),
(2), (4) Date: Jun. 25, 2012

(87) PCT Pub. No.: WO2011/078498
PCT Pub. Date: Jun. 30, 2011

(65) Prior Publication Data
US 2012/0280840 A1    Nov. 8, 2012

(30) Foreign Application Priority Data

Dec. 23, 2009 (KR) .................. 10-2009-0129586
Sep. 2, 2010 (KR) .................. 10-2010-0085911

(51) Int. Cl.
*H04L 27/00* (2006.01)
*H04B 1/00* (2006.01)
*H03F 3/191* (2006.01)
*H04B 1/04* (2006.01)

(52) U.S. Cl.
CPC .............. *H04B 1/0092* (2013.01); *H03F 3/191* (2013.01); *H04B 1/0007* (2013.01); *H04B 2001/0433* (2013.01)

(58) Field of Classification Search
None
See application file for complete search history.

(56) References Cited

U.S. PATENT DOCUMENTS

| 8,259,843 | B2* | 9/2012 | Cai et al. ................. 375/295 |
| 8,260,145 | B2* | 9/2012 | Gupta et al. ............... 398/115 |
| 8,311,509 | B2* | 11/2012 | Feher ..................... 455/404.2 |
| 8,331,886 | B2* | 12/2012 | Wang et al. .............. 455/132 |
| 8,693,525 | B2* | 4/2014 | Rick et al. ............... 375/146 |
| 2006/0115028 | A1 | 6/2006 | Schenk |
| 2007/0287401 | A1 | 12/2007 | Cleary et al. |

FOREIGN PATENT DOCUMENTS

DE    10063308 A1    7/2001
DE    69722566 T2    4/2004
(Continued)

*Primary Examiner* — Adolf Dsouza
(74) *Attorney, Agent, or Firm* — William Park & Associates Ltd.

(57) ABSTRACT

Provided is a multi-mode ultra broadband wireless communication apparatus and method, and a multi-mode ultra broadband transmitting apparatus may include a baseband outputting unit to parallelly output multiple digital signals, a mid-frequency processing unit to up-convert the outputted parallel digital signals to mid-frequencies, and the up-conversion is performed in a range where the outputted parallel digital signals do not cause interference with each other, a parallel-to-serial converter to convert, to a serial digital signal, the converted parallel digital signals that are up-converted to the mid-frequencies, a digital-to-analog converter to convert the serial digital signal to an analog signal, and a radio frequency processing unit to up-convert the analog signal to multiple transmission frequencies respectively corresponding to desired communication services.

4 Claims, 16 Drawing Sheets

(56) References Cited

FOREIGN PATENT DOCUMENTS

| DE | 102004054323 | A1 | 7/2005 |
| DE | 102004054070 | B4 | 12/2008 |
| EP | 0844765 | A2 | 5/1998 |
| EP | 0827642 | B1 | 9/2000 |
| KR | 1020050021196 | A | 3/2005 |
| KR | 1020050058789 | A | 6/2005 |
| KR | 1020050066566 | A | 6/2005 |
| KR | 1020057016698 | A | 9/2005 |
| KR | 1020070098045 | A | 10/2007 |
| KR | 1020090019067 | A | 2/2009 |

\* cited by examiner

MULTIPLE-MODE BROADBAND WIRELESS COMMUNICATION DEVICE AND METHOD

TECHNICAL FIELD

The present invention relates to an ultra broadband wireless communication, and more particularly, to an ultra broadband wireless communication apparatus and method operating in a multi-mode and multi-band.

BACKGROUND ART

A multi-mode scheme may be a scheme where a single terminal processes at least two signals. Examples of a terminal using the multi-mode scheme may include a smart phone that uses both a wireless telephone service based on a 3G cellular mobile communication and a wireless Internet service based on a WiFi scheme, a cell phone that uses both a 3G communication service and a DMB broadcast service, and the like. Various types of terminal based on the multi-mode scheme are continuously provided, and are applied in a field of a ubiquitous device.

To support a multi-mode signal, a transceiver may use an antenna, a power amplifier (PA), and a circuit including a signal processor for each signal. As a number of service signals increase, a number of elements to be used by the transceiver increases and thus, a size of a device is larger, increasing a power consumption.

DISCLOSURE OF INVENTION

Technical Goals

An aspect of the present invention provides a terminal using a multi-mode signal, and the terminal may mix multiple digital signals modulated based on respective communication services in a range where the multiple digital signals do not cause interference with each other and may simultaneously process the mixed signal and thus, the terminal may enable multi-wireless communication, may minimize a size of a device, and may allow performance with low power consumption.

Another aspect of the present invention also provides a multi-mode ultra broadband wireless transceiving apparatus that may process a signal using a wide bandwidth such as a high-speed wireless communication signal together with a different service signal.

Technical Solutions

According to an aspect of an exemplary embodiment, there is provided a multi-mode ultra broadband transmitting apparatus, the apparatus including a baseband outputting unit to parallelly output multiple digital signals, a mid-frequency processing unit to up-convert the outputted parallel digital signals to mid-frequencies, and the up-conversion is performed in a range where the outputted parallel digital signals do not cause interference with each other, a parallel-to-serial converter to convert, to a serial digital signal, the converted parallel digital signals that are up-converted to the mid-frequencies, a digital-to-analog converter to convert the serial digital signal to an analog signal, and a radio frequency processing unit to up-convert the analog signal to multiple transmission frequencies respectively corresponding to desired communication services.

According to another aspect of an exemplary embodiment, there is provided a multi-mode ultra broadband receiving apparatus, the apparatus including a radio frequency processing unit to down-convert multiple analog signals to mid-frequencies, and the down-conversion is performed in a range where the multiple analog signals do not cause interference with each other, a parallel-to-serial converting unit to convert the down-converted parallel analog signals to a serial analog signal, an analog-to-digital converter to convert the serial analog signal to a digital signal, a mid-frequency processing unit to down-convert the digital signals to multiple baseband signals, and a baseband receiving unit to receive the down-converted multiple baseband signals.

According to another aspect of an exemplary embodiment, there is provided a multimode ultra broadband transceiving apparatus, the apparatus including a mid-frequency processing unit to up-convert multiple parallel digital signals existing in a baseband to mid-frequencies, and the up-conversion is performed in a range where the multiple parallel digital signals do not cause interference with each other, a first parallel-to-serial converter to up-convert, to a serial digital signal, the up-converted parallel digital signals that are up-converted to the mid-frequencies, a digital-to-analog converter to convert the serial digital signal to an analog signal, a first radio frequency processing unit to up-convert the analog signal to multiple transmission frequencies respectively corresponding to desired communication services, a transmission and reception signal separating unit to separate the up-converted analog signal that is up-converted to the multiple transmission frequencies and multiple analog signals received from an outside, a second radio frequency processing unit to down-convert the multiple analog signals received from the outside in a range where the multiple analog signals do not cause interference with each other, a second parallel-to-serial converter to convert the down-converted parallel analog signals to a serial analog signal, and an analog-to-digital converter to convert the serial analog signal to a digital signal.

Effect

According to example embodiments, there is a provided a terminal using a multi-mode signal, and the terminal may perform sampling by mixing multiple digital signals modulated based on respective schemes desired by communication services in a range where the multiple digital signals do not cause interference with each other and thus, the terminal may enable a multi-wireless communication, may minimize a size of device, may increase hardware efficiency of a transceiving module, may allow efficient performance with low power consumption, and may enable high-speed signal processing.

According to example embodiments, there is provided a multi-mode ultra broadband wireless transceiving apparatus that may process a signal using a wide bandwidth such as a high-speed wireless communication signal together with a different service signal.

BEST MODE FOR CARRYING OUT THE INVENTION

Figure 1:
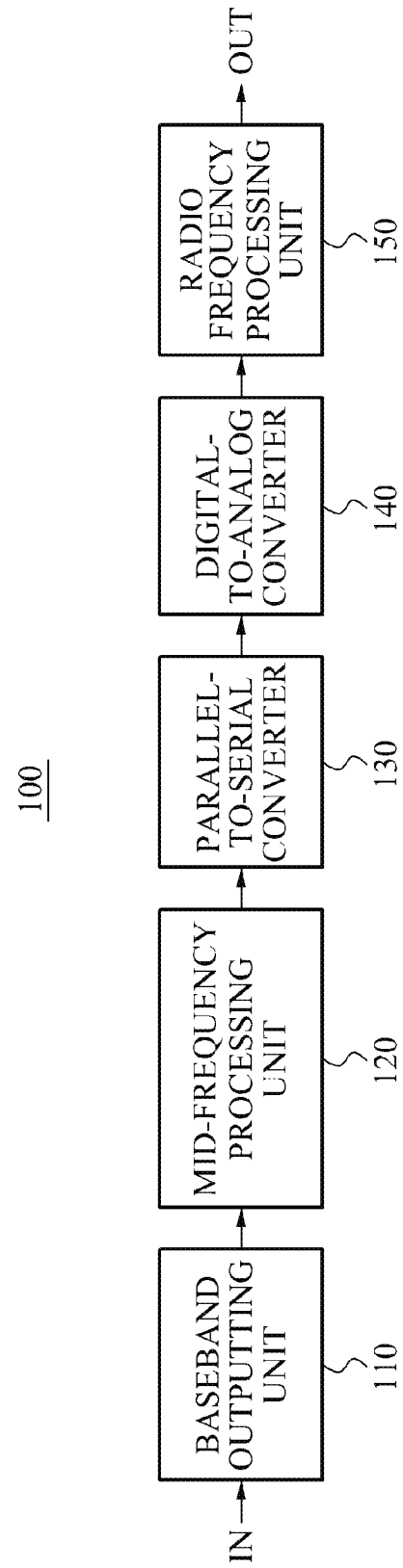
FIG. 1 is a block diagram illustrating a multi-mode ultra broadband transmitting apparatus according to an embodiment of the present invention.

Although a few exemplary embodiments of the present invention have been shown and described, the present invention is not limited to the described exemplary embodiments, wherein like reference numerals refer to the like elements throughout.

FIG. 1 illustrates a multi-mode ultra broadband transmitting apparatus 100 according to an embodiment of the present invention.

Referring to FIG. I, the multi-mode ultra broadband transmitting apparatus 100 may include a baseband outputting unit 110, a mid-frequency processing unit 120, a parallel-to-serial converter 130, a digital-to-analog converter 140, and a radio frequency processing unit 150.

The baseband outputting unit 110 may parallelly output multiple digital signals that are modulated based on respective schemes desired by corresponding communication services and are inputted. For example, the baseband outputting unit 110 may parallelly output multiple signals that are modulated based on respective schemes of communication services, such as a 3G scheme, a WiFi scheme, a DMB scheme, a WiMAX scheme, and the like, and are inputted.

The mid-frequency processing unit 120 may up-convert, to mid-frequency signals, the outputted parallel digital signals, and the up-conversion may be performed in a range where the outputted parallel digital signals do not cause interference with each other. Frequency bands of the signals that are up-converted to mid-frequencies may not overlap with each other in the range. Determining of the mid-frequencies for the up-conversion in the range will be described in FIGS. 2, 9, 10, and 11.

The parallel-to-serial converter 130 may convert, to a serial digital signal, the parallel digital signals that arc up-converted to mid-frequencies. The parallel-to-serial converter 130 may convert, to the serial digital signal, the parallel digital signals having different frequencies, and may enable a single DAC/ADC signal processor to process the serial digital signal.

The digital-to-analog converter 140 may convert the serial digital signal to an analog signal. In this example, the digital-to-analog converter 140 may need a high sampling speed and a low power consumption, to convert the serial digital signal of various frequencies to the analog signal. Therefore, when a high-speed complementary metal-oxide-semiconductor (CMOS) digital-to-analog converter/analog-to-digital converter (DAC/ADC) is used, input signals of various communication services are simultaneously sampled and thus, a signal processing is efficient and a high-speed signal processing with low power consumption is possible.

The radio frequency processing unit 150 may up-convert the analog signal to transmission frequencies respectively corresponding to desired communication services. The analog signal still have mid-frequencies and thus, the radio frequency processing unit 150 up-convert the frequencies to transmit signals with transmission frequencies desired by corresponding communication services, such as the 3G scheme, the WiFi scheme, the WiMAX, and the like. The radio frequency processing unit 150 may include band pass filters (BPFs) that filter the up-converted signals into bands desired by corresponding communication services to parallelly output the up-converted signals.

Figure 2:
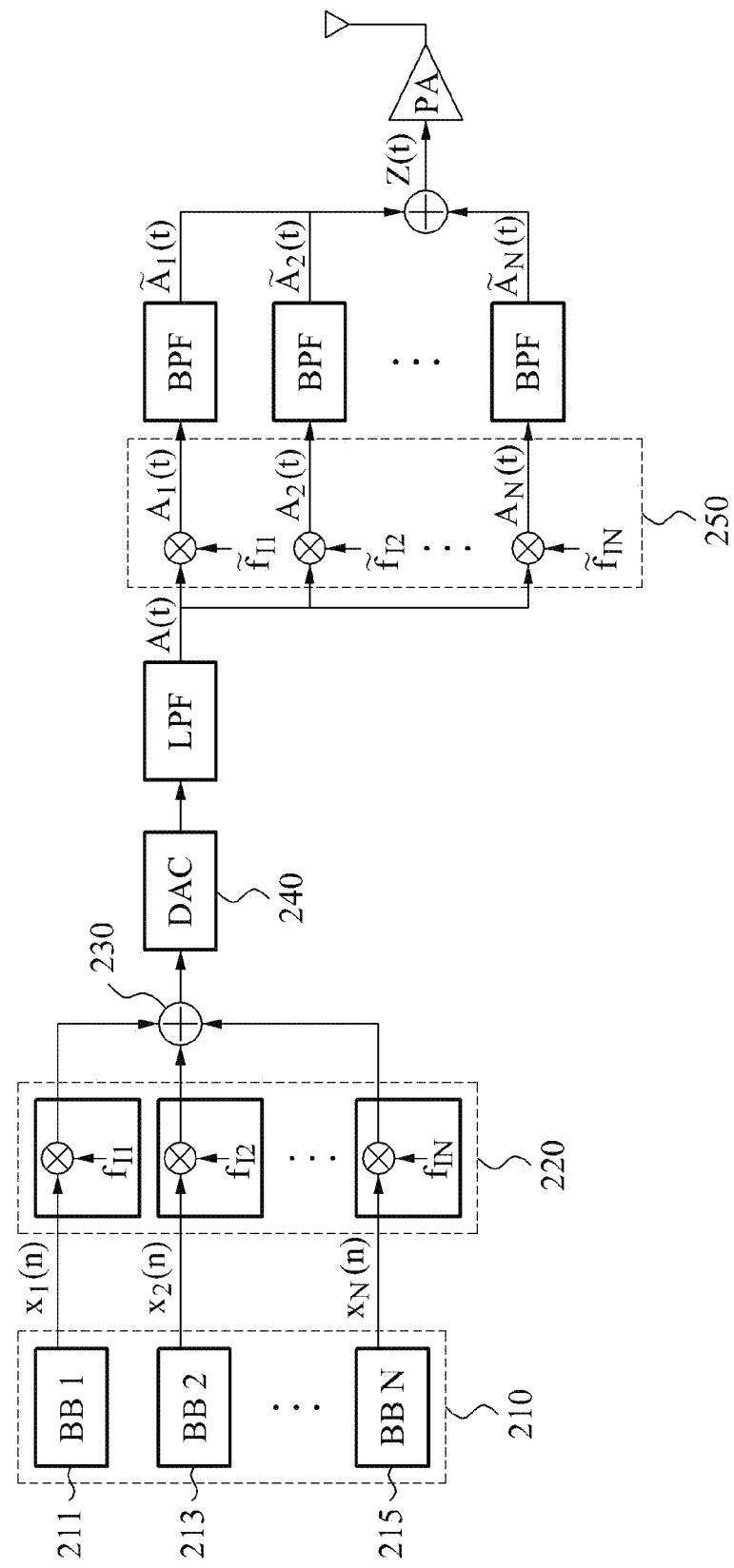
FIG. 2 is a diagram illustrating a multi-mode ultra broadband transmitting apparatus according to an embodiment of the present invention.

FIG. 2 illustrates a multi-mode ultra broadband transmitting apparatus of FIG. 1.

Referring to FIG. 2, the multi-mode ultra broadband transmitting apparatus may include a baseband outputting unit 210, a mid-frequency processing unit 220, a parallel-to-serial converter 230, a digital-to-analog converter 240, and a radio frequency processing unit 250. The multi-mode ultra broadband transmitting apparatus may further include an additional signal processor.

The baseband outputting unit 210 may include N baseband processors 211, 213, and 215 that outputs N digital signals that are modulated based on respective schemes desired by corresponding communication services. In this example, outputted N digital signals may be expressed by $x_1(n)$, $x_2(n)$, ..., and $x_N(n)$.

The mid-frequency processing unit 220 may up-convert frequencies of the N parallel digital signals by mixing mid-frequencies, such as $f_{f1}, f_{f2}, \ldots, f_{fN}$, and the conversion may be performed in a range where the N parallel digital signals, such as $x_1(n), x_2(n), \ldots, x_N(n)$, do not cause interference with each other. In this example, each mid-frequency ($f_{fi}$, $1 \leq i \leq N$) may have a guard band (GB) and thus, may not cause interference with each other.

The parallel-to-serial converter 230 adds all signals that are up-converted to the mid-frequencies to be a single broadband signal. Accordingly, the parallel-to-serial converter 230 may change multiple parallel signals outputted from the mid-frequency processing unit 220 to a serial signal to process the multiple parallel signals with a single digital analog converter.

The digital-to-analog converter 240 may convert, to an analog signal, the digital signals that are converted into the serial signal. The analog signal may pass through a low pass filter (LPF) and unnecessary signals are removed. In this example, a signal A(t) that passes through the LPF may be defined by the following equation:

$$A(t)=x_1(t)\cos(2\pi f_{I1}t)+ \quad . \quad . \quad . \quad +x_i(t)\cos(2\pi f_{Ii}t)+\ldots+x_N(t)\cos(2\pi f_{IN}t), 1\leq i,j \leq N.$$

The signal A(t) that is the serial analog signal is obtained by up-converting signals modulated based on respective schemes desired by corresponding communication services and adding all the up-converted signals into a single signal in a time domain.

The radio frequency processing unit 250 may up-convert the signal A(t) that is the serial analog signal to frequency bands corresponding to communication services by multiplying the signal A(t) by a predetermined radio frequency signals. For example, the radio frequency processing unit 250 may multiply the signal A(t) by a frequency signal $\cos(2\pi \widetilde{f_{ij}} t)$ of a $j^{th}$ to transmit a $j^{th}$ signal.

Therefore, $A_j(t)=A(t)\cos(2\pi \widetilde{f_{ij}} t)$. In the time domain, this is expressed by following equation:

$$A_j(t) = \{x_1(t)\cos(2\pi f_{I1}t) + \ldots + x_i(t)\cos(2\pi f_{Ii}t) + \ldots + x_N(t)\cos(2\pi f_{IN}t)\}$$
$$\cos(2\pi \widetilde{f_{ij}} t) = x_1(t)\cos(2\pi f_{I1}t)\cos(2\pi \widetilde{f_{ij}}) + \ldots +$$
$$x_i(t)\cos(2\pi \widetilde{f_{ij}} t)\cos(2\pi \widetilde{f_{ij}}) + \ldots + x_N(t)\cos(2\pi f_{IN}t)\cos(2\pi \widetilde{f_{ij}} t) =$$
$$\frac{1}{2}[x_1(t)\cos(2\pi(f_{I1}+\widetilde{f_{ij}})t) + x_1(t)\cos(2\pi(f_{I1}-\widetilde{f_{ij}})t) + \ldots +$$
$$x_i(t)\cos(2\pi(f_{Ii}+\widetilde{f_{ij}})t) + x_i(t)\cos(2\pi(f_{Ii}-\widetilde{f_{ij}})t) + \ldots +$$
$$x_N(t)\cos(2\pi(f_{IN}+\widetilde{f_{ij}})t) + x_N(t)\cos(2\pi(f_{IN}-\widetilde{f_{ij}})t)].$$

In a frequency domain, this is expressed by following equation:

$$A_j(f) = \frac{1}{2}[X_1(f)*\{\delta(f-(f_{I1}+\widetilde{f_{ij}}))+\delta(f+(f_{I1}+\widetilde{f_{ij}}))\} +$$
$$X_1(f)*\{\delta(f-(f_{I1}-\widetilde{f_{ij}}))\delta(f+(f_{I1}-\widetilde{f_{ij}}))\} + \ldots +$$
$$X_i(f)*\{\delta(f-(f_{Ii}+\widetilde{f_{ij}}))+\delta(f+(f_{Ii}+\widetilde{f_{ij}}))\} +$$
$$X_i(f)*\{\delta(f-(f_{Ii}-\widetilde{f_{ij}}))+\delta(f+(f_{Ii}-\widetilde{f_{ij}}))\} + \ldots +$$
$$X_N(f)*\{\delta(f-(f_{IN}+\widetilde{f_{ij}}))+\delta(f+(f_{IN}+\widetilde{f_{ij}}))\} +$$
$$X_N(f)*\{\delta(f-(f_{IN}-\widetilde{f_{ij}}))+\delta(f+(f_{IN}-\widetilde{f_{ij}}))\}]$$
$$A_j(f) = \frac{1}{2}[\{X_1(f-(f_{I1}+\widetilde{f_{ij}}))+X_1(f+(f_{I1}+\widetilde{f_{ij}}))\} +$$
$$\{X_1(f-(f_{I1}-\widetilde{f_{ij}}))+X_1(f+(f_{I1}-\widetilde{f_{ij}}))\} +$$
$$\ldots + \{X_i(f-(f_{Ii}+\widetilde{f_{ij}}))+X_i(f+(f_{Ii}+\widetilde{f_{ij}}))\} +$$
$$\{X_i(f-(f_{Ii}-\widetilde{f_{ij}}))+X_i(f+(f_{Ii}-\widetilde{f_{ij}}))\} + \ldots +$$
$$\{X_N(f-(f_{IN}+\widetilde{f_{ij}}))+X_N(f+(f_{IN}+\widetilde{f_{ij}}))\} +$$
$$\{X_N(f-(f_{IN}-\widetilde{f_{ij}}))+X_N(f+(f_{IN}-\widetilde{f_{ij}}))\}] =$$

$$\frac{1}{2}[\{X_1(f-(\widetilde{f_{ij}}+f_{I1}))+X_1(f+(\widetilde{f_{ij}}+f_{I1}))\} +$$
$$\{X_1(f+(\widetilde{f_{ij}}-f_{I1}))+X_1(f-(\widetilde{f_{ij}}-f_{I1}))\} +$$
$$\ldots + \{X_i(f-(\widetilde{f_{ij}}+f_{Ii}))+X_i(f+(\widetilde{f_{ij}}+f_{Ii}))\} +$$
$$\{X_i(f+(\widetilde{f_{ij}}-f_{Ii}))+X_i(f-(\widetilde{f_{ij}}-f_{Ii}))\} + \ldots +$$
$$\{X_N(f-(\widetilde{f_{ij}}+f_{IN}))+X_N(f+(\widetilde{f_{ij}}+f_{IN}))\} +$$
$$\{X_N(f+(\widetilde{f_{ij}}-f_{IN}))+X_N(f-(\widetilde{f_{ij}}-f_{IN}))\}].$$

The signal $A_j(f)$ may be expressed by N mid-frequencies $f_{I1}, f_{I2}, \ldots,$ and, $f_{IN}$, that is, a combination of $f_{Ii}$ and $\widetilde{f_{ij}}$. In this example, $A_j(f)$ may exist in a frequency band expressed by the combination of $f_{Ii}$ and $\widetilde{f_{ij}}$. Therefore, the radio frequency processing unit 250 may adjust $f_{Ii}$ and $\widetilde{f_{ij}}$ to transmit a signal $X_j$ of when i=j, with a corresponding transmission frequency $f_{cj}$. A relational expression of a transmission frequency, a mid-frequency, and a radio frequency with respect to the signal $X_j$ of when i=j may be defined by Equation 1.

$$f_{cj}=\widetilde{f_{ij}}-f_{Ij} \qquad \text{[Equation 1]}$$

Signals that do not satisfy Equation 1 may be removed by BPFs.

The radio frequency processing unit 250 may apply a radio frequency value of Equation 1 to each of N−1 signals from among N signals to enable the signals to be carried by corresponding transmission frequencies.

The N signals ($\tilde{A}_i(t)$, $1 \leq i \leq N$) that pass through respective BPFs may be added to be a single serial signal, may be subject to a transmission power amplifier, and may be simultaneously transmitted via an antenna.

The mid-frequency $f_{Ii}$ may be determined based on the radio frequency $\widetilde{f_{i1}}$, $1 \leq i \leq N$, the GB, and the bandwidth of each signal.

The GB is determined based on a bandwidth of a BPF of the radio frequency processing unit 250, an error rate, and a price of a terminal. When signals are up-converted by the radio frequency processing unit 250, the BPF may separate signals in radio frequency bands by filtering in an order from a most adjacent signal. In this example, a bandwidth that unambiguously separates signals may be determined based on a performance of the BPF. Therefore, original signals are clearly separated from the signals when the signals are more than a width of the bandwidth of the BPF apart from each other.

The performance of the BPF may be changed based on a characteristic of each signal and thus, a GB of each (signal?) may not need to be the same. When the GB is wide, the error rate decreases and a band consumption increases. When the GB is narrow, a BPF having superior performance may be needed and thus, a price of the terminal may become expensive. Therefore, the GB may be determined based on a function of each terminal.

The mid-frequency may be determined based on the bandwidth of each signal. Signals having different bandwidths may cause interference with each other, while being up-converted by the mid-frequency processing unit 220 and the radio frequency processing unit 250. Therefore, the mid-frequency $f_{Ii}$ to prevent interference between signals may be determined based on the following Equations.

$$f_{li} = \frac{BW_k}{2} + \frac{BW_i}{2} + GB_i + f_{lk}, 1 \leq i \neq k \leq N. \quad \text{[Equation 2]}$$

$$f_{li} = \frac{BW_k}{2} + \frac{BW_i}{2} + GB_i + \tilde{f}_{lk}^- + f_{ck}, i = m. \quad \text{[Equation 3]}$$

Equations 2 and 3 may be widely applied to various methods where the mid-frequency processing unit 220 up-converts signals of different bandwidths to mid-frequencies. The various methods will be described with reference to FIGS. 9, 10, and 11.

Figure 3:
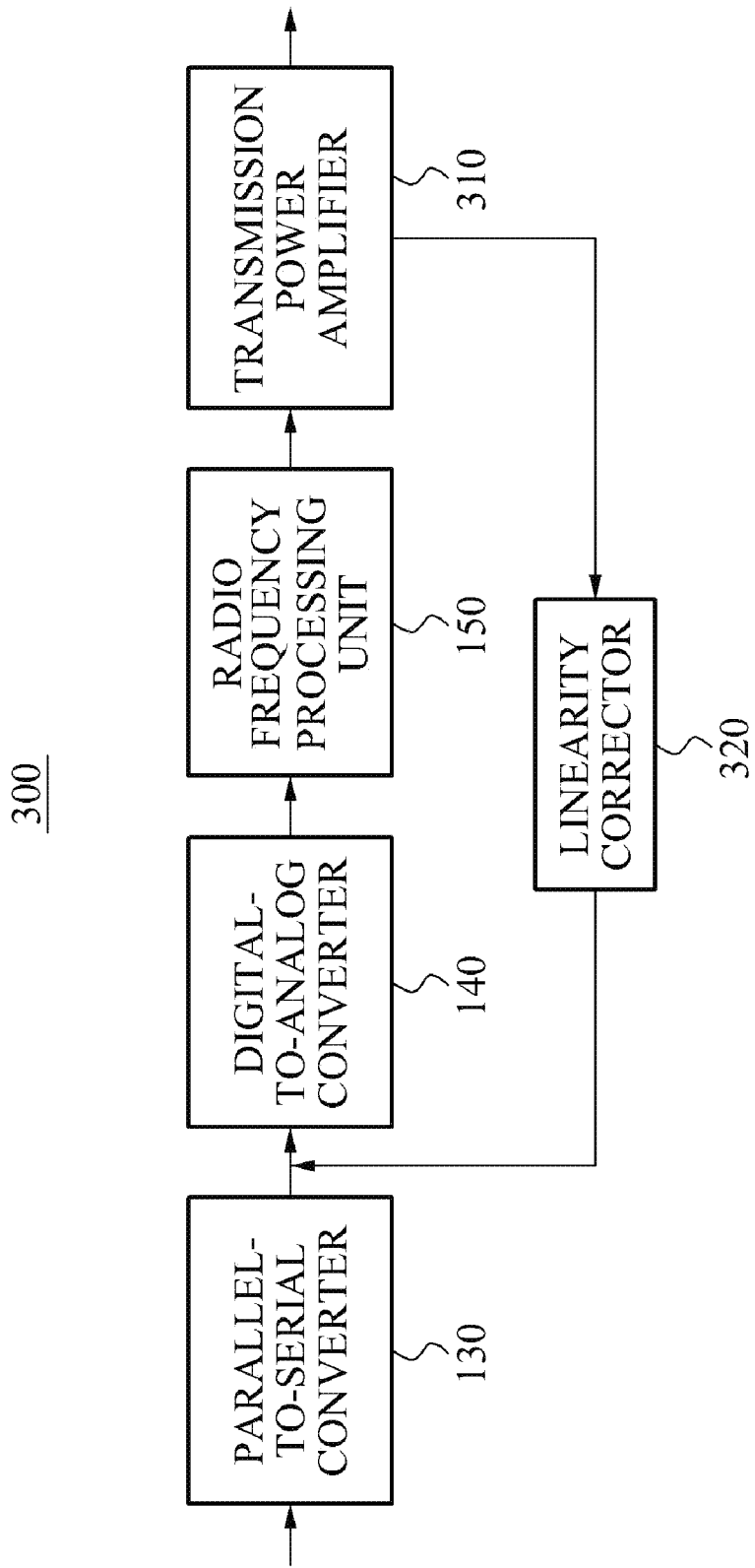
FIG. 3 is a block diagram illustrating a multi-mode ultra broadband transmitting apparatus including a linearity corrector according to an embodiment of the present invention.

FIG. 3 illustrates a multi-mode ultra broadband transmitting apparatus 300 including a linearity corrector according to an embodiment of the present invention.

Referring to FIG. 3, the multi-mode ultra broadband transmitting apparatus 300 may further include a transmission power amplifier 310 and a linearity corrector 320, compared with the multi-mode ultra broadband transmitting apparatus 100 of FIG. 1.

The transmission power amplifier 310 may amplify a signal that is up-converted to a transmission frequency corresponding to a communication service. For example, the transmission power amplifier 310 may amplify the signal that is up-converted to respective transmission frequency to be transmitted via an antenna.

The linearity corrector 320 may correct a linearity of the signal amplified by the transmission power amplifier 310. In this example, the linearity corrector 320 may provide a feedback to the transmission power amplifier 310 and may return to an operation prior to an operation where the radio frequency processing unit 150 performs to compare the signal with the feed back signal and thus, the linearity of each signal may be corrected. The radio frequency processing unit 150 adds a transmission power amplifier to each up-converted signal to correct the linearity.

Figure 4:
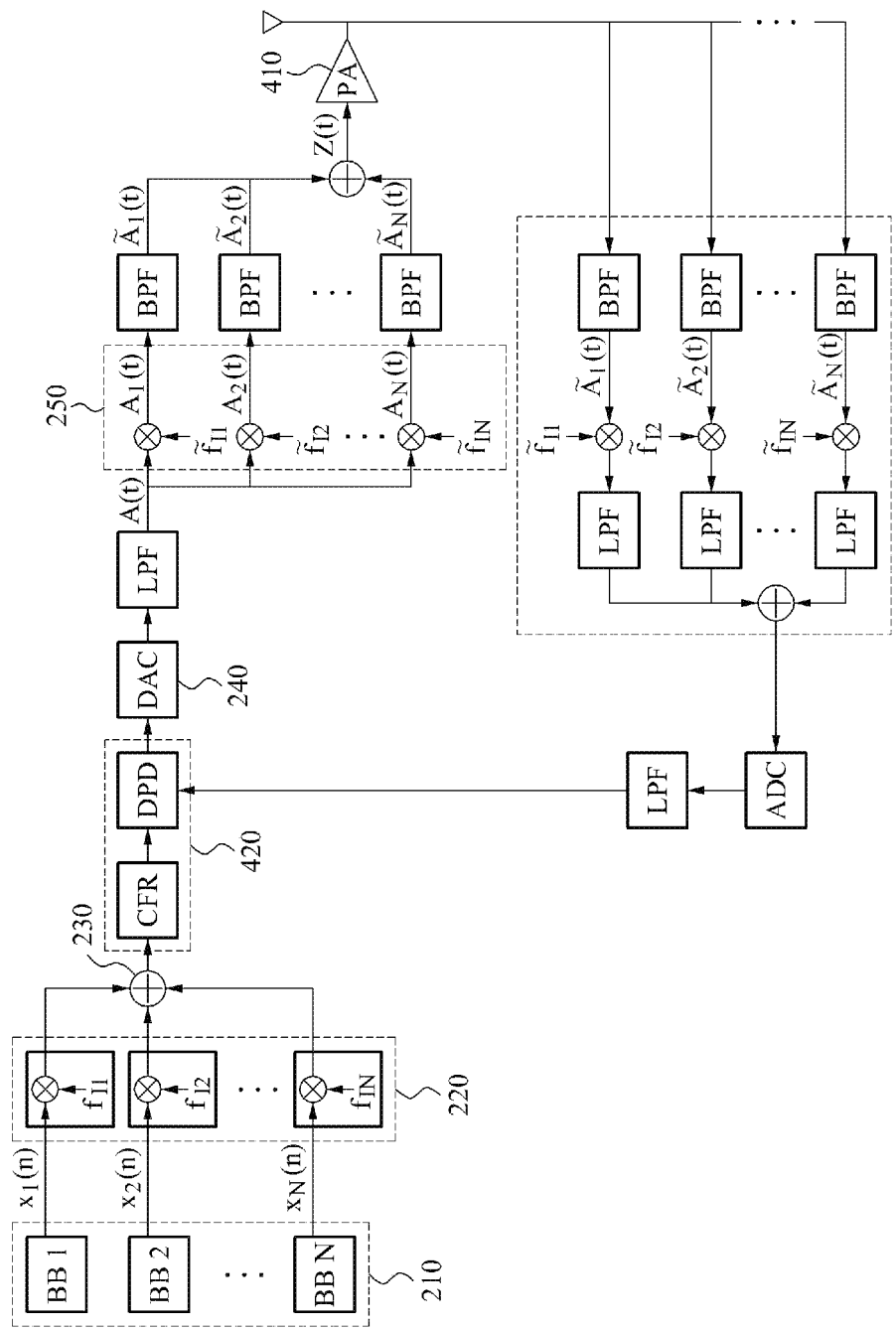
FIG. 4 is a diagram illustrating a multi-mode ultra broadband transmitting apparatus using a feedback according to an embodiment of the present invention.

FIG. 4 illustrates a multi-mode ultra broadband transmitting apparatus using a feedback according to an embodiment of the present invention.

Referring to FIG. 4, the multi-mode ultra broadband transmitting apparatus may include the base band outputting unit 210, the mid-frequency processing unit 220, the parallel-to-serial converter 230, the digital-to-analog converter 240, and the radio frequency processing unit 250, like the multi-mode ultra broadband transmitting apparatus of FIG. 2. The multi-mode ultra broadband transmitting apparatus of FIG. 4 may further include a transmission power amplifier 410, a feedback end, and a linearity corrector 420.

The transmission power amplifier 410 may amplify each signal $\tilde{A}_i(t)$, $1 \leq 1 \leq N$ that is up-converted to a transmission frequency by the radio frequency processing unit 250 and that is added into a single serial signal ($Z(t)$).

The feedback end may apply a BPF to a desired frequency band of each communication system to enable the single serial signal to be multiple signals again, may apply corresponding radio frequencies, and may convert analog signals again to digital signals.

The linearity corrector 420 may receive the digital signals outputted from the feedback end, may compare the received digital signals with a signal outputted from the parallel-to-serial converter 230, and may correct a linearity of the transmission power amplifier 410. For example, the linearity corrector 420 may include a digital pre-distorter or a crest factor reduction (CFR). The digital pre-distorter may compare a signal inputted from the feedback end and a signal outputted from the parallel-to-signal converter 230, and may perform pre-distortion with respect to the signal outputted from the parallel-to-serial converter 230 using a single in an opposite form of the signal outputted from the transmission power amplifier 410, while maintaining a characteristic of the signal outputted from the transmission power amplifier 410, and thus, the linearity may be partially corrected.

The CFR may correct a linearity of an amplified signal by decreasing a crest factor of the signal outputted from the parallel-to-serial converter 230.

Figure 5:
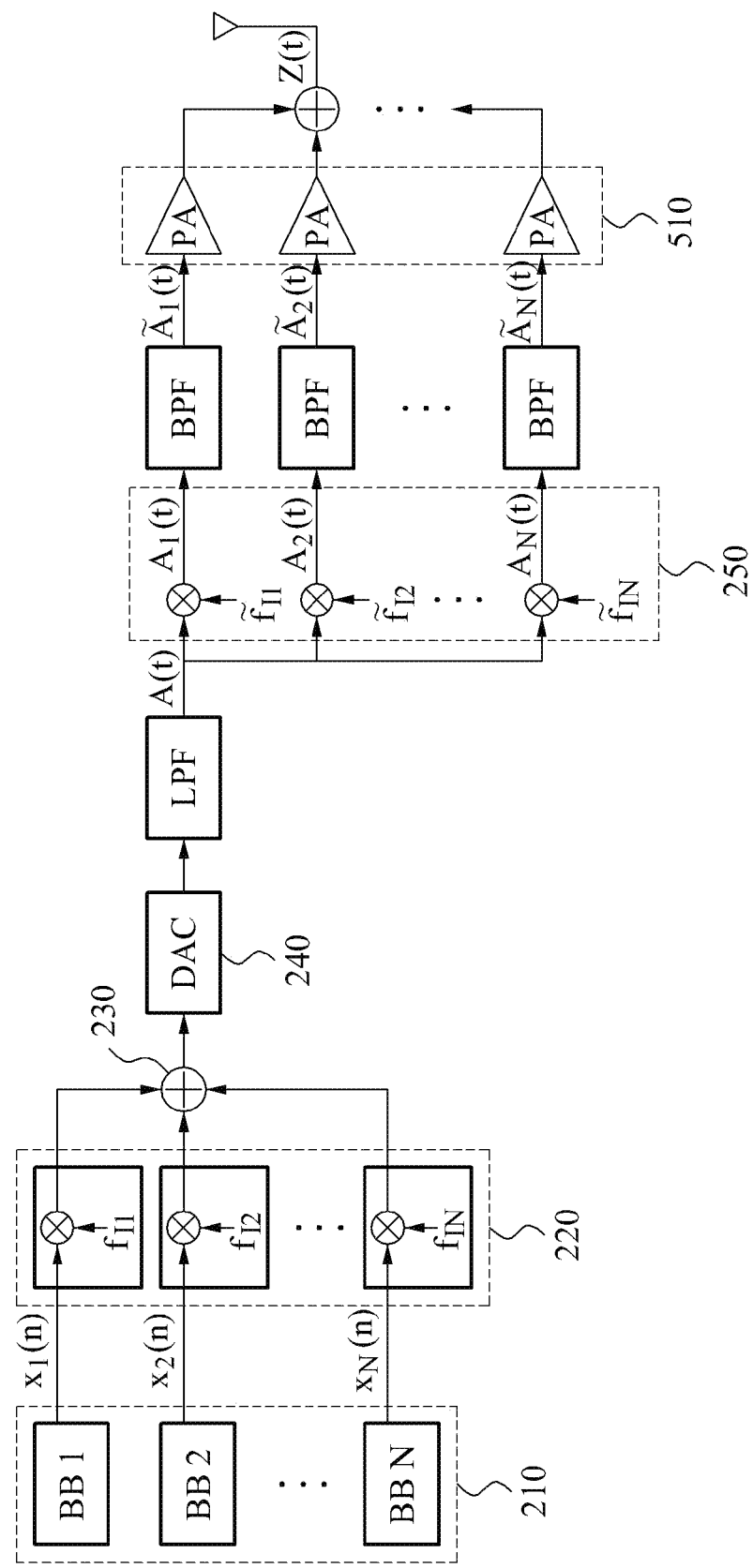
FIG. 5 is a diagram illustrating a multi-mode ultra broadband transmitting apparatus including multiple power amplifiers according to an embodiment of the present invention.

FIG. 5 illustrates a multi-mode ultra broadband transmitting apparatus including multiple power amplifiers according to an embodiment of the present invention.

Referring to FIG. 5, the multi-mode ultra broadband transmitting apparatus may include the baseband outputting unit 210, the mid-frequency processing unit 220, the parallel-to-serial converter 230, the digital-to-analog converter 240, the radio frequency processing unit 250, similar to the multi-mode ultra broadband transmitting apparatus of FIG. 1. The multi-mode ultra broadband transmitting apparatus of FIG. 5 may further include multiple transmission power amplifiers 510.

The multiple transmission power amplifiers 510 may respectively amplify N signals $\tilde{A}_i(t)$, $1 \leq i \leq N$ that are up-converted by the radio frequency processing unit 250 and respectively pass through BPFs.

The multiple transmission power amplifiers 510 may more effectively correct and guarantee a linearity by amplifying the respective signals, compared with when a serial signal where signals are added is amplified.

Figure 6:
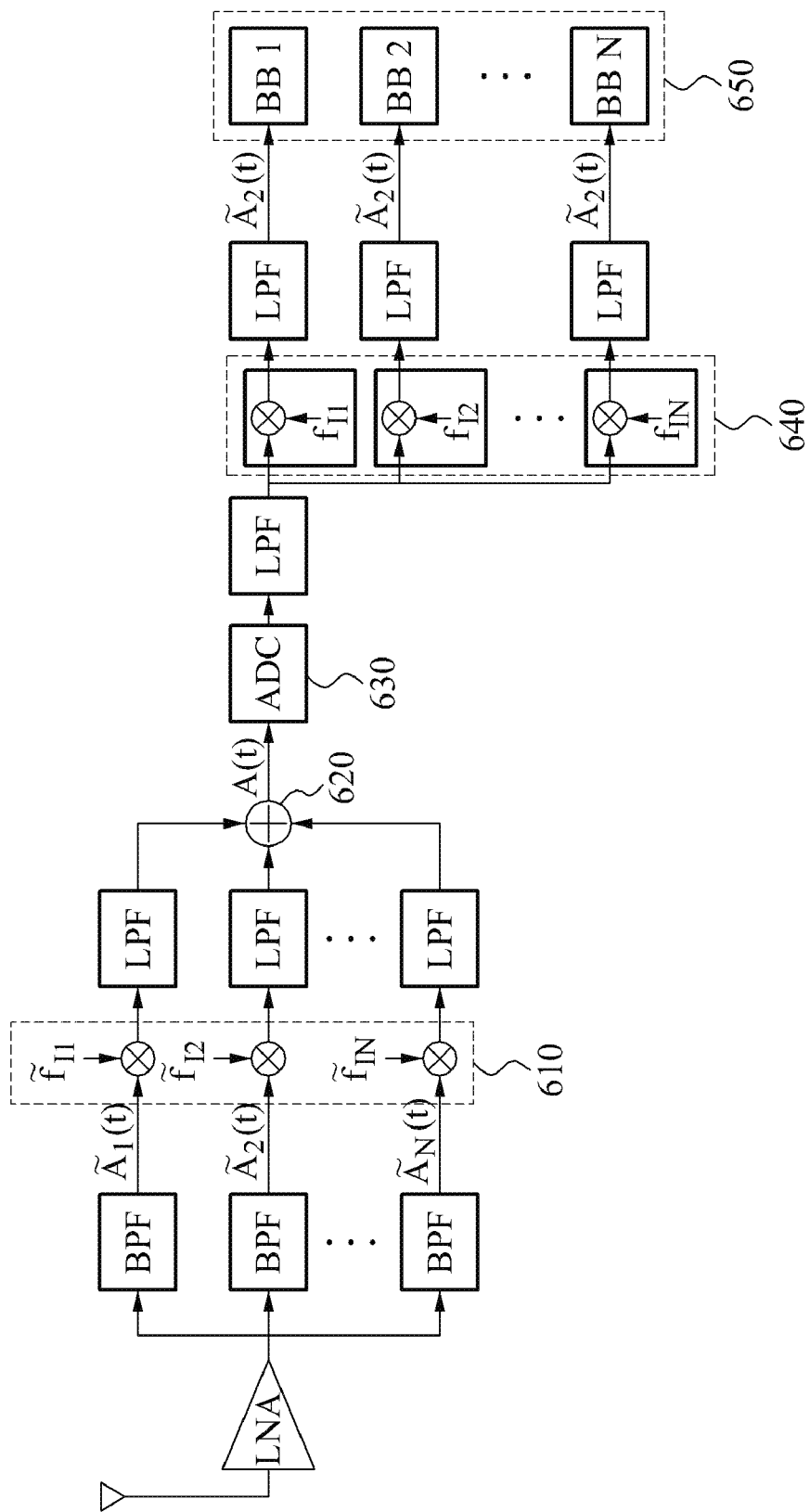
FIG. 6 is a diagram illustrating a multi-mode ultra broadband receiving apparatus according to an embodiment of the present invention.

FIG. 6 illustrates a multi-mode ultra broadband receiving apparatus according to an embodiment of the present invention.

Referring to FIG. 6, the multi-mode ultra broadband receiving apparatus may include a radio frequency processing unit 610, a parallel-to-serial converter 620, an analog-to-digital converter 630, a mid-frequency processing unit 640, and a baseband receiving unit 650.

The radio frequency processing unit 610 may down-convert received multiple analog signals into mid-frequencies, and the down-conversion is performed in a range where the received multiple analog signals do not cause interference with each other. or example, a low noise amplifier may remove a signal undesired by a communication system, that is, noise, from a signal received via an antenna. The signal where the noise is removed may pass through BPFs, and may be separated to signals of N transmission frequency bands, that is, $\tilde{A}_i(t)$, $1 \leq i \leq N$. Each signal may be down-converted to a mid-frequency by a corresponding radio frequency in the radio frequency processing unit 610.

The parallel-to-serial converter 620 may convert, to a serial analog signal, parallel analog signals that are down-converted to mid-frequencies. In this example, N parallel signals are converted into a single serial signal.

The analog-to-digital converter 630 may convert the serial analog signal into a digital signal. In this example, the analog-to-digital converter 630 may need a high sampling speed and a low power consumption, to convert the serial analog signal of various frequencies to the digital signal.

The mid-frequency processing unit 640 may down-convert the digital signal into multiple baseband signals. The mid-frequency processing unit 640 may down-convert the single digital signal into N baseband signals $x_1(n), x_2(n), \ldots, x_N(n)$, using each mid-frequency $f_{li}$.

The baseband receiving unit 650 may receive the multiple baseband signals that are down-converted. The baseband receiving unit 650 may receive N baseband signals $x_1(n)$, $x_2(n), \ldots, x_N(n)$, and may process the signals based on respective modulation schemes desired by corresponding communication services.

Figure 7:
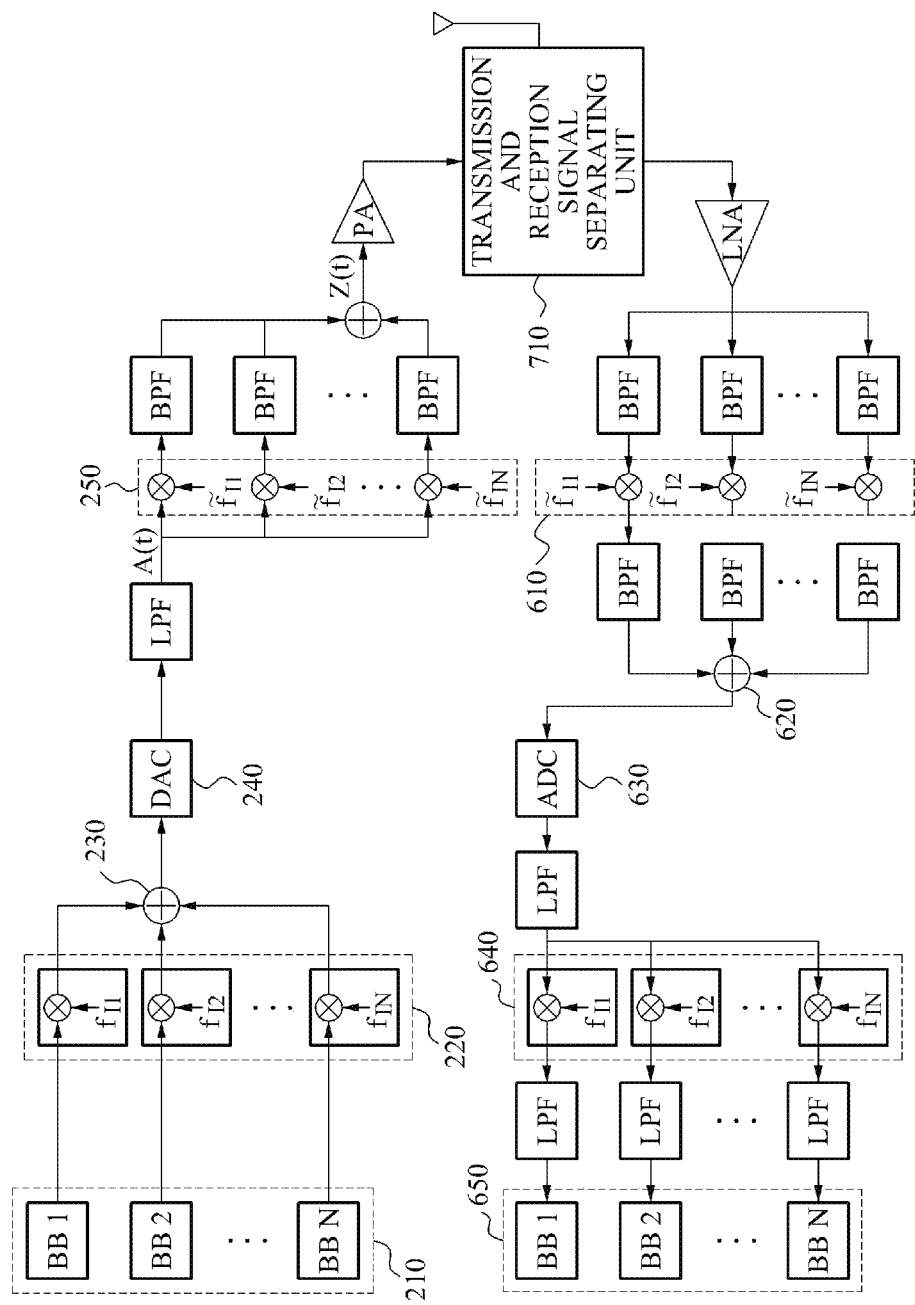
FIG. 7 is a diagram illustrating a multi-mode broadband transceiving apparatus according to an embodiment of the present invention.

FIG. 7 illustrates a multi-mode broadband transceiving apparatus according to an embodiment of the present invention.

Referring to FIG. 7, the multi-mode ultra broadband transceiving apparatus may include the baseband outputting unit 210, the mid-frequency processing unit 220, the parallel-to-serial converter 230, the digital-to-analog converter 240, the radio frequency processing unit 250, similar to the multi-mode ultra broadband transmitting apparatus of FIG. 2, and may include the radio frequency processing unit 610, the parallel converter 620, the analog-to-digital converter 630, the mid-frequency processing unit 640, and the baseband receiving unit 650, similar to the multi-mode ultra broadband receiving apparatus of FIG. 6. The multi-mode ultra broadband transceiving apparatus may further include a transmission and reception signal separating unit 710.

The transmission and reception signal separating unit 710 may separate analog signals that are up-converted to transmission frequencies in the radio frequency processing unit 250 and multiple analog signals received from an outside of the transceiving apparatus. The transmission and reception signal separating unit 710 may distinguish internal transmission signals from received external signals.

The transmission and reception separating unit 710 may use a half duplex (HD) communication or a full duplex (FD) communication. In the HD communication, one side transmits information and the other side receives the transmitted information and thus, the HD communication may not simultaneously perform transmission and reception of information. In the FD communication, voice information may be simultaneously transmitted and received.

The FD communication may be classified as a time division duplex (TDD) scheme and a frequency division duplex (FDD) scheme, based on a function. The TDD scheme may divide time to distinguish transmission signals from received signals. The TDD scheme may be useful when an uplink and a downlink have different transmission speeds. Examples of a communication system using the TDD scheme may include a W-CDMA which is mostly used in home, a time division-synchronous CDMA (TD-SCDMA) system, an IEEE-802.16 WiMAX scheme, DECT scheme, an IEEE 802.15.3c wireless personal area network (WPAN) scheme, an ECMA-387 WPAN scheme, an ISO/IEC 13156 WPAN scheme, an IEEE 802.1 lad scheme, and the like. The FDD scheme may distinguish transmission signals from received, signals based on a frequency. The FDD scheme may be useful when the uplink and the downlink have the same transmission speed. Even when the FDD scheme consumes a relatively great amount of frequency bandwidth, a system using the FDD scheme may not be complex and may be effective. Example of the system using the FDD scheme may include an asymmetric digital subscriber line (ADSL) system, a very high bit rate digital subscriber line (VDSL) system, a code division multiple access (CDMA) 2000 system, a universal mobile telecommunication system (UMTS)/WCDMA in an FDD mode, an IEEE 802.16 WiMAX system in the FDD mode, and the like.

The transmission and reception signal separating unit 710 may operate as a duplexer in the FDD mode, and as a switch in the TDD mode.

Figure 8:
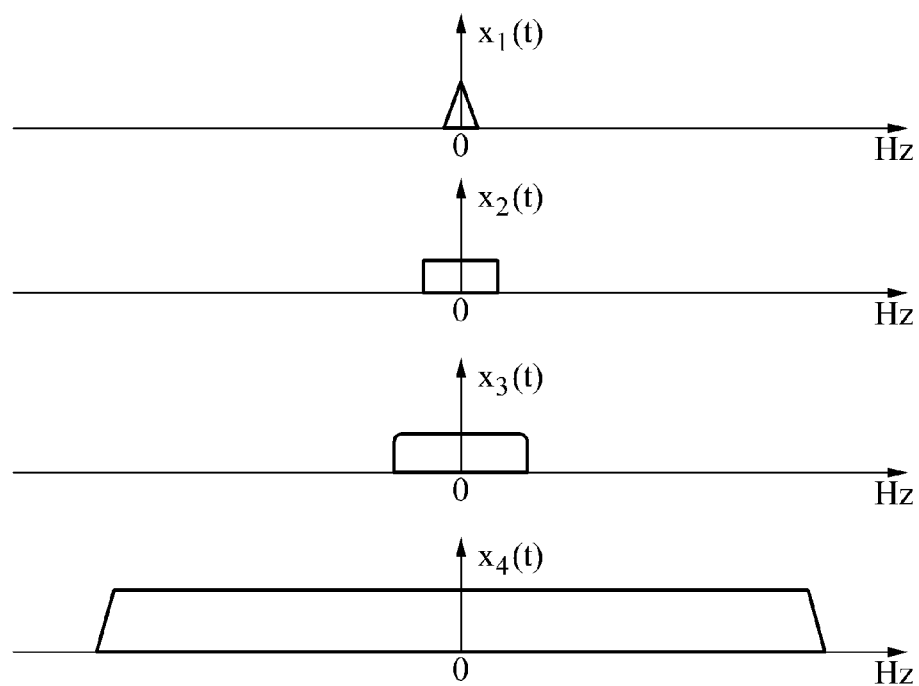
FIG. 8 is a diagram illustrating a frequency band of a multi-mode signal to be inputted to a baseband outputting unit according to an embodiment of the present invention.

FIG. 8 illustrates a frequency band of a multi-mode signal to be inputted to a baseband outputting unit according to an embodiment of the present invention.

Referring to FIG. 8, $x_1(t), x_2(t), x_3(t)$, and $x_4(t)$ may denote multi-mode signals existing in the baseband and having various frequency bands. A width of each frequency band may be $x_1(t) \ll x_2(t) \ll x_3(t) \ll x_4(t)$.

Figure 9:
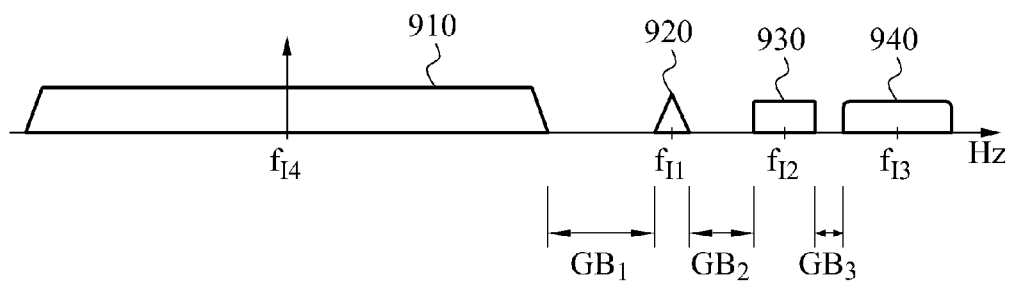
FIG. 9 is a diagram illustrating a frequency band of a multi-mode signal that is up-converted by a mid-frequency processing unit according to an embodiment of the present invention (Case I)

FIG. 9 illustrates a frequency band of a multi-mode signal that is up-converted by a mid-frequency processing unit according to an embodiment of the present invention (Case I).

Referring to FIG. 9, the mid-frequency processing unit in a multi-mode ultra broad band transmitting apparatus may transmit, to a baseband, a signal 910 having a largest bandwidth from among multiple digital signals outputted from a baseband outputting unit, and may up-convert remaining signals 920, 930, and 940 to frequency bands that are higher than the baseband.

The mid-frequency processing unit may place the signal 910 in the baseband (mid-frequency $f_{I4}=0$), and may respectively up-convert, to mid-frequencies $f_{I1}, f_{I2}$, and $f_{I3}$, the remaining signals 920, 930, and 940 respectively having guard bands $GB_1, GB_2$, and $GB_3$ and thus, may not cause interference with each other. In this example, the mid-frequency signal $f_{I4}=0$, and remaining mid-frequencies $f_{I1}, f_{I2}$, and $f_{I3}$ may be assigned based on Equation 2.

$$f_{Ii} = \frac{BW_k}{2} + \frac{BW_i}{2} + GB_i + f_{Ik}, \ 1 \le i \ne k \le N. \quad \text{[Equation 2]}$$

A $K^{th}$ signal is a signal existing in a band a mid-frequency of which is one-level lower than a mid-frequency of an $I^{th}$ signal.

The mid-frequency processing may most effectively use the frequency band. Therefore, the signals converted in the mid-frequency processing unit may be most stably and effectively processed in the digital-to-analog converter.

Figure 10:
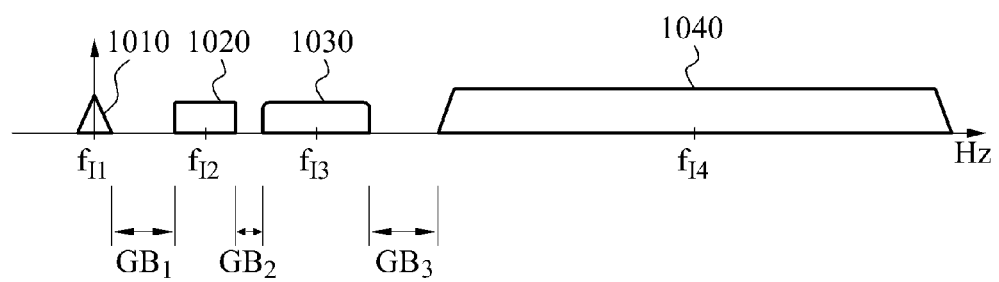
FIG. 10 is a diagram illustrating a frequency band of a multi-mode signal that is up-converted by a mid-frequency processing unit according to an embodiment of the present invention (Case II)

FIG. 10 illustrates a frequency band of a multi-mode signal that is up-converted by a mid-frequency processing unit according to an embodiment of the present invention (Case II).

Referring to FIG. 10, the mid-frequency processing unit in the multi-mode ultra broadband transmitting apparatus may up-convert a signal 1040 having a greatest bandwidth from among multiple digital signals outputted from a baseband outputting unit to a frequency band that is higher than frequency bands of remaining signals 1010, 1020, and 1030.

The mid-frequency processing unit may allocate the signal 1040 to a highest frequency band (mid-frequency $f_{I4}$), and may up-convert, to mid-frequencies $f_{I1}, f_{I2}$, and $f_{I3}$, remaining signals 1010, 1020, and 1030, which have relatively low small bandwidth and respectively have appropriate guard bands $GB_1, GB_2$, and $GB_3$, to not cause interference with each other including the baseband. In this example, the mid-frequencies $f_{I1}, f_{I2}, f_{I3}$, and $f_{I4}$ may be allocated based on Equation 2 and Equation 3.

$$f_{Ii} = \frac{BW_k}{2} + \frac{BW_i}{2} + GB_i + f_{Ik}, \ 1 \le i \ne k \le N. \quad \text{[Equation 2]}$$

$$f_{Ii} = \frac{BW_k}{2} + \frac{BW_i}{2} + GB_i + f_{Ik}^- + f_{ck}, \ i = m. \quad \text{[Equation 3]}$$

The mid-frequency $f_{I4}$ of the signal 1040 may be allocated based on Equation 3 and the remaining mid-frequencies $f_{I1}, f_{I2}$, and $f_{I3}$ may be allocated based on Equation 2. A $K^{th}$ signal may be located in a band of which a mid-frequency is one-level lower than a mid-frequency of an $I^{th}$ signal.

Figure 11:
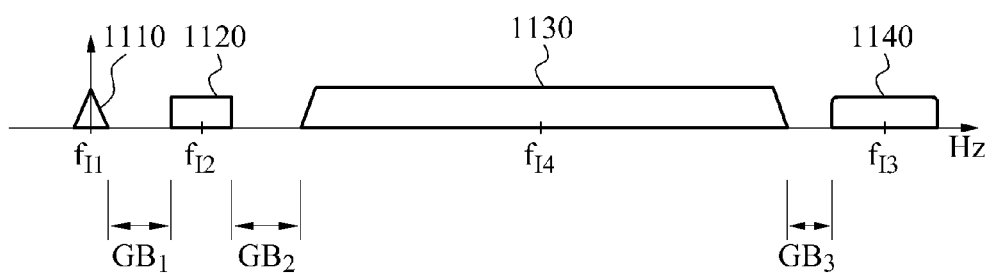
FIG. 11 is a diagram illustrating a frequency band of a multi-mode signal that is up-converted by a mid-frequency processing unit according to an embodiment of the present invention (Case III)

FIG. 11 illustrates a frequency band of a multi-mode signal that is up-converted by a mid-frequency processing unit according to an embodiment of the present invention (Case III).

Referring to FIG. 11, the mid-frequency processing unit in the multi-mode ultra broadband transmitting apparatus may up-convert a signal 1130 having a largest bandwidth from among multiple digital signals outputted from a baseband outputting unit, to a frequency band that is between frequency bands of remaining signals 1110 and 1120.

The mid-frequency processing unit may up-convert, to mid-frequencies $f_{I1}$ and $f_{I2}$, signals 1110 and 1120 having relatively small bandwidth and respectively having appropriate guard bands $GB_1$ and $GB_2$, to not cause interference with each other including the baseband. The signal 1130 may be up-converted to a next mid-frequency $f_{I4}$ and a signal 1140 having a relatively small bandwidth may be up-converted to a band $f_{I3}$ that is higher than the mid-frequency $f_{I4}$. In this example, mid-frequencies $f_{I1}$, $f_{I2}$, $f_{I3}$, and $f_{I4}$ may be allocated based on Equation 2 and Equation 3.

$$f_{Ii} = \frac{BW_k}{2} + \frac{BW_i}{2} + GB_i + f_{Ik}, \ 1 \le i \ne k \le N. \quad \text{[Equation 2]}$$

$$f_{Ii} = \frac{BW_k}{2} + \frac{BW_i}{2} + GB_i + \tilde{f}_{Ik} + f_{ck}, \ i = m. \quad \text{[Equation 3]}$$

The mid-frequency $f_{I4}$ of the signal 1130 may be allocated based on Equation 3 and the remaining mid-frequencies $f_{I1}$, $f_{I2}$, and $f_{I3}$ may be allocated based on Equation 2.

Figure 12:
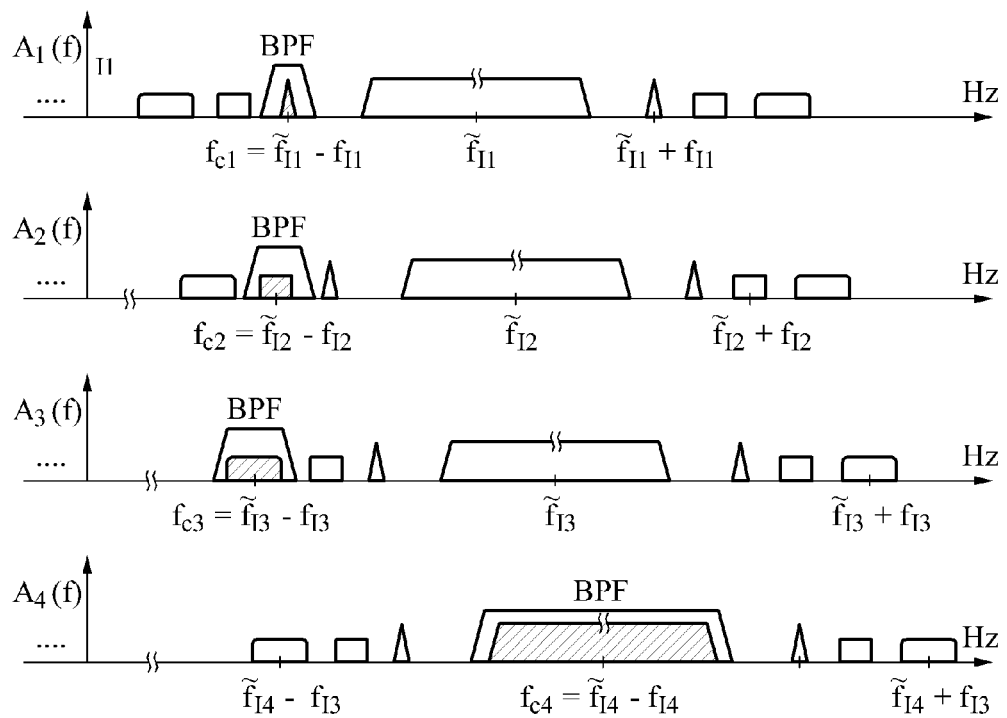
FIG. 12 is a diagram illustrating a frequency band of a multi-mode signal that is up-converted by a radio frequency processing unit according to an embodiment of the present invention (Case I)

FIG. 12 illustrates a frequency band of a multi-mode signal that is up-converted by a radio frequency processing unit according to an embodiment of the present invention (Case I).

Referring to FIG. 12, the radio frequency processing unit in the multi-mode ultra broadband transmitting apparatus may up-convert signals converted by a digital-to-analog converter, to transmission frequencies corresponding to communication services. The signals up-converted to the transmission frequencies corresponding to the communication services may pass through respective BPFs and thus, signals corresponding to the communication services may only be outputted.

A signal A(t) that is a serial analog signal may be up-converted to a radio frequency $\tilde{f}_{Ij}$ corresponding to a corresponding communication service. In this example, when a transmission frequency $f_{cj}$ of each communication service is set, the radio frequency $\tilde{f}_{Ij}$ may be calculated based on a relational expression $f_{cj} = \tilde{f}_{Ij} - f_{Ij}$.

In FIG. 12, $A_1(f)$, $A_2(f)$ $A_3(f)$, and $A_4(f)$ may denote spectrums of respective signals passing through the radio frequency processing unit, when it is Case I where a signal having a largest bandwidth exists in a baseband.

In a case of the $A_1(f)$, when $f_{c1}$ is set, a radio frequency $\tilde{f}_{I1}$ may be calculated based on the relational expression $f_{cj} = \tilde{f}_{Ij} - f_{Ij}$, and a spectrum of each signal may be predicted. The $A_1(f)$ may include positive frequency spectrums of various signals and negative frequency spectrums in the same image of the positive frequency spectrums.

A signal corresponding to a communication service, that is, only a signal corresponding to the transmission frequency $f_{c1}$, may be outputted through the BPF from among multiple signals of the $A_1(f)$. The same situation is performed with respect to each of $A_2(f)$, $A_3(f)$, and $A_4(f)$. Therefore, a signal of a band desired by each communication service may be outputted.

Figure 13:
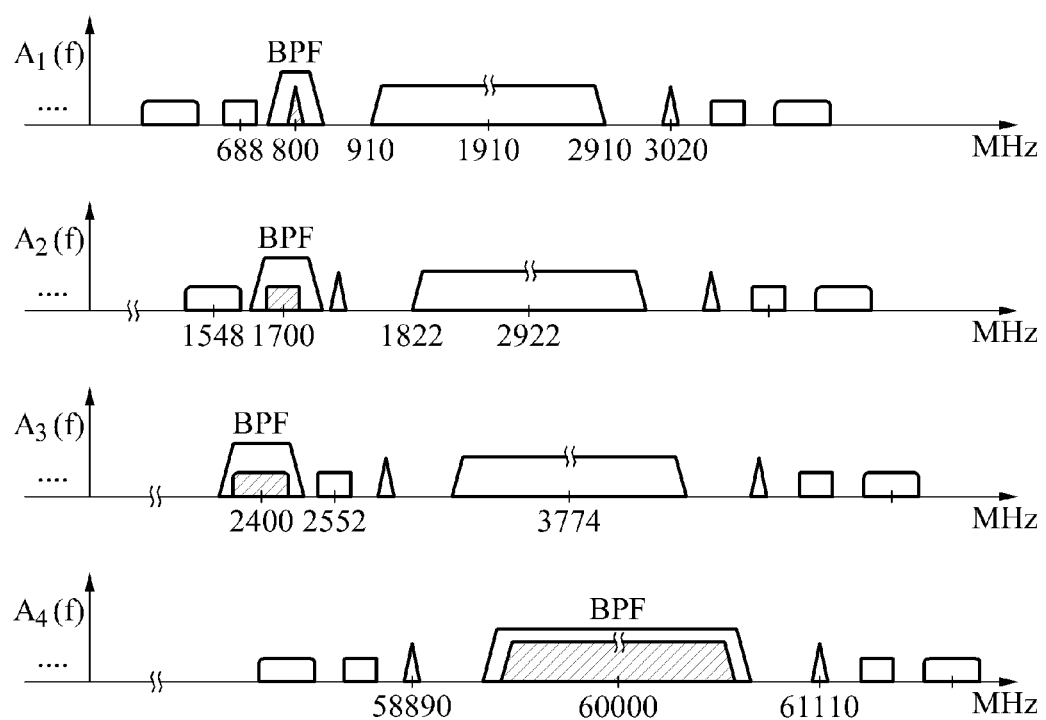
FIG. 13 is a diagram illustrating an example of a multi-mode signal that is up-converted by applying a frequency value in a radio frequency processing unit in Case I of FIG. 9.

FIG. 13 illustrates an example of a multi-mode signal that is up-converted by applying a frequency value in a radio frequency processing unit in Case I of FIG. 9.

| | | | | | | |
|---|---|---|---|---|---|---|
| | | | Case □ | | | |
| | BW (MHz) | | $f_c$ | | $f_{1i}$ | |
| $x_1(t)$ | 20 | $f_{c1}$ | 800 | $f_{11}$ | 1110 | 1910 |
| $x_2(t)$ | 4 | $f_{c2}$ | 1700 | $f_{12}$ | 1222 | 2922 |
| $x_3(t)$ | 100 | $f_{c3}$ | 2400 | $f_{13}$ | 1374 | 3774 |
| $x_4(t)$ | 2000 | $f_{c4}$ | 60000 | $f_{14}$ | 0 | 60000 |

[Equation 1]
$f_{cj} = -f_{Ij}$.
[Equation 2]
$$f_{Ii} = \frac{BW_k}{2} + \frac{BW_i}{2} + GB_i + f_{Ik}, \ 1 \le i \ne k \le N.$$

A bandwidth of a fourth signal is a signal having a largest bandwidth and thus, is set so that $f_{I4}=0$ MHz. $\tilde{f}_{I4} = 60000$ MHz based on Equation 1. A mid-frequency $f_{Ii}$ and a radio frequency $\tilde{f}_{Ij}$ may be calculated by sequentially applying a first signal, second signal, and third signal to Equation 1 and Equation 2, and using 100 MHz as a GB. A $K^{th}$ signal may be a signal located in a band of which a mid-frequency is one-lower than an $I^{th}$ signal.

$$f_{I1} = \frac{BW_4}{2} + \frac{BW_1}{2} + GB + f_{I4}$$
$$= 1000 + 10 + 100 + 0$$
$$= 1110 \text{ MHz}$$

$$\tilde{f}_{I1} = f_{c1} + f_{I1}$$
$$= 800 + 1110$$
$$= 1910 \text{ MHz}$$

$$f_{I2} = \frac{BW_1}{2} + \frac{BW_2}{2} + GB + f_{I1}$$
$$= 10 + 2 + 100 + 1110$$
$$= 1222 \text{ MHz}$$

$$\tilde{f}_{I2} = f_{c2} + f_{I2}$$
$$= 1700 + 1222$$
$$= 2922 \text{ MHz}$$

$$f_{I3} = \frac{BW_2}{2} + \frac{BW_3}{2} + GB + f_{I2}$$
$$= 2 + 50 + 100 + 1222$$
$$= 1374 \text{ MHz}$$

$$\tilde{f}_{I3} = f_{c3} + f_{I3}$$
$$= 2400 + 1374$$
$$= 3744 \text{ MHz}$$

Each signal $A_1(f)$, $1 \le i \le N$ that is up-converted by the radio frequency processing unit may pass through a BPF corresponding to a corresponding communication service and thus, only $\tilde{A}_1(t)$, $\tilde{A}_2(t)$, $\tilde{A}_3(t)$ and $\tilde{A}_4(t)$ may be outputted.

Figure 14:
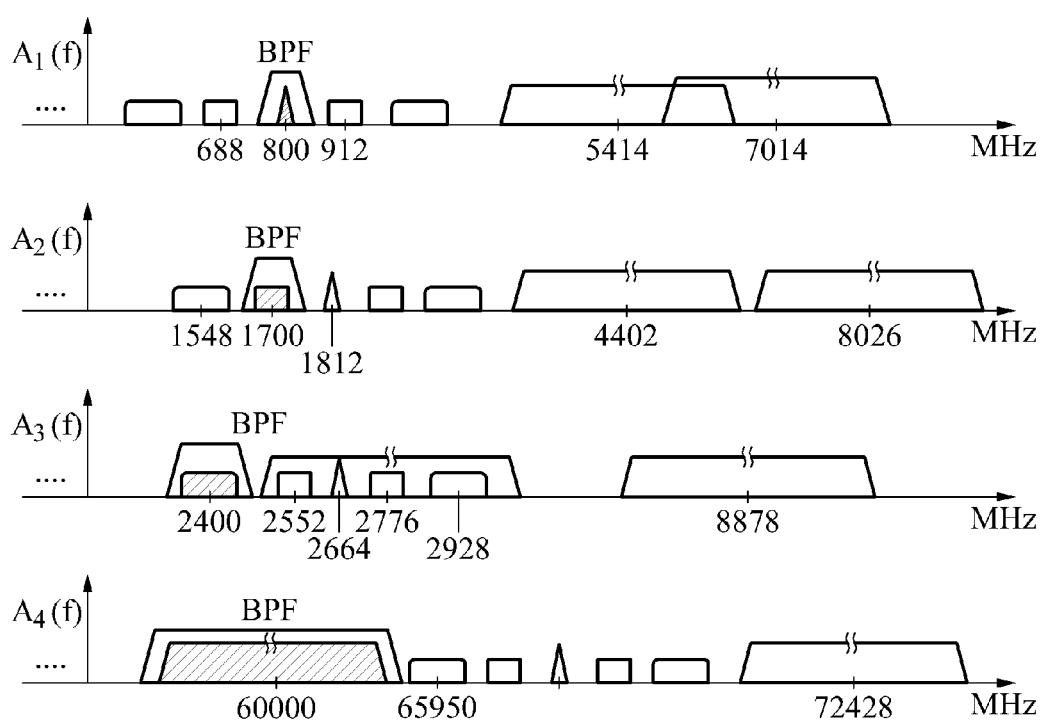
FIG. 14 is a diagram illustrating an example of a multi-mode signal that is up-converted by applying a frequency value in a radio frequency processing unit in Case II of FIG. 10.

FIG. 14 illustrates an example of a multi-mode signal that is up-converted by applying a frequency value in a radio frequency processing unit in Case II of FIG. 10

| Case II | | | | | |
|---|---|---|---|---|---|
| | BW (MHz) | | $f_c$ | $f_{1i}$ | |
| $x_1(t)$ | 20 | $f_{c1}$ | 800 | $f_{11}$ | 0 | 800 |
| $x_2(t)$ | 40 | $f_{c2}$ | 1700 | $f_{12}$ | 112 | 1812 |
| $x_3(t)$ | 100 | $f_{c3}$ | 2400 | $f_{13}$ | 264 | 2664 |
| $x_4(t)$ | 2000 | $f_{c4}$ | 60000 | $f_{14}$ | 6214 | 66214 |

[Equation 1]
$$f_{ej} = -f_{lj}$$
[Equation 2]
$$f_{li} = \frac{BW_k}{2} + \frac{BW_i}{2} + GB_i + f_{lk}, \ 1 \le i \ne k \le N.$$
[Equation 3]
$$f_{li} = \frac{BW_k}{2} + \frac{BW_i}{2} + GB_i + \widetilde{f_{lk}} + f_{ck}, \ i = m.$$

When a mid-frequency $f_{l1}$ of a first signal is set to 0 Hz, $\widetilde{f_{l1}} = 800$ MHz may be obtained. Mid-frequencies and radio frequencies of a second signal and a third signal may be calculated based on Equation 2 and Equation 1.

$$f_{l2} = \frac{BW_1}{2} + \frac{BW_2}{2} + GB + f_{l1}$$
$$= 10 + 2 + 100 + 0$$
$$= 112 \text{ MHz}$$

$$\widetilde{f_{l2}} = f_{c2} + f_{l2}$$
$$= 1700 + 112$$
$$= 1812 \text{ MHz}$$

$$f_{l3} = \frac{BW_2}{2} + \frac{BW_3}{2} + GB + f_{l2}$$
$$= 2 + 50 + 100 + 112$$
$$= 264 \text{ MHz}$$

$$\widetilde{f_{l3}} = f_{c3} + f_{l3}$$
$$= 2400 + 264$$
$$= 2664 \text{ MHz}$$

A mid-frequency and a radio frequency of a signal having a largest bandwidth may be calculated based on Equation 3 and Equation 1.

$$f_{l4} = \frac{BW_3}{2} + \frac{BW_4}{2} + GB + \widetilde{f_{l3}} + f_{c3}$$
$$= 50 + 1000 + 100 + 2664 + 2400$$
$$= 6214$$

$$\widetilde{f_{l4}} = f_{c4} + f_{l4}$$
$$= 60000 + 6214$$
$$= 66214 \text{ MHz}$$

Each signal $A_i(t)$, $1 \le i \le N$ that is up-converted by the radio frequency processing unit may pass through a BPF corresponding to corresponding communication service and thus, only $\widetilde{A_1}(t), \widetilde{A_2}(t), \widetilde{A_3}(t)$ and $\widetilde{A_4}(t)$ may be outputted.

Figure 15:
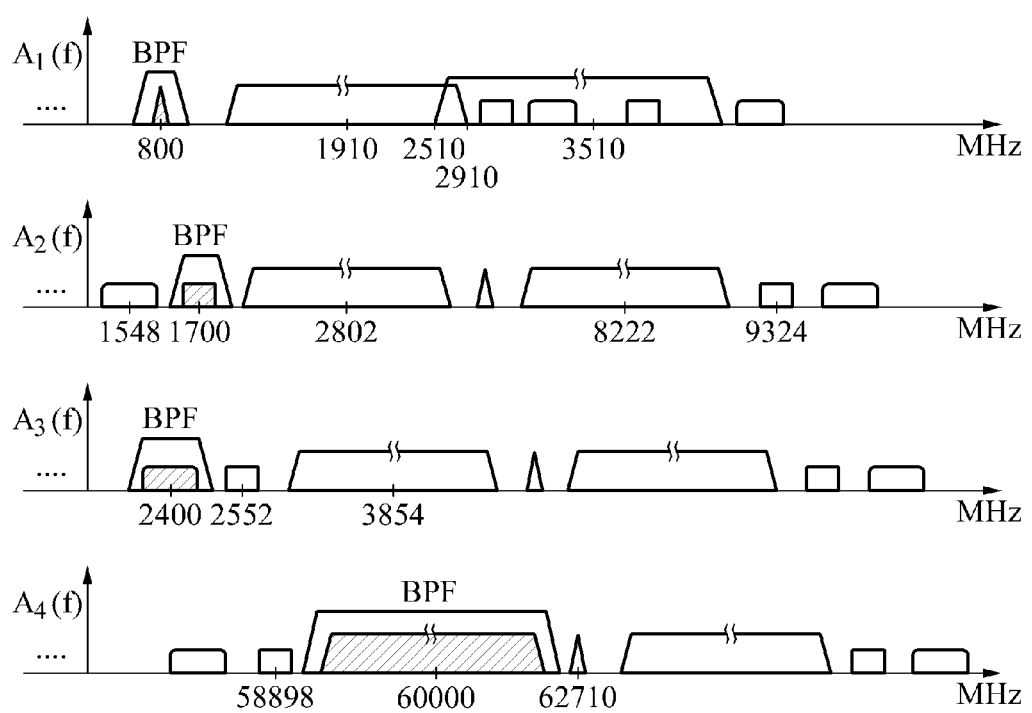
FIG. 15 is a diagram illustrating an example of a multi-mode signal that is up-converted by applying a frequency value in a radio frequency processing unit in Case III of FIG. 11.

FIG. 15 illustrates an example of a multi-mode signal that is up-converted by applying a frequency value in a radio frequency processing unit in Case III of FIG. 11.

| Case III | | | | | |
|---|---|---|---|---|---|
| | BW (MHz) | | $f_c$ | $f_{1i}$ | |
| $x_1(t)$ | 20 | $f_{c1}$ | 800 | $f_{11}$ | 0 | 800 |
| $x_2(t)$ | 40 | $f_{c2}$ | 1700 | $f_{12}$ | 3812 | 5512 |
| $x_3(t)$ | 100 | $f_{c3}$ | 2400 | $f_{13}$ | 3964 | 6364 |
| $x_4(t)$ | 2000 | $f_{c4}$ | 60000 | $f_{14}$ | 2710 | 62710 |

[Equation 1]
$$f_{ej} = -f_{lj}$$
[Equation 2]
$$f_{li} = \frac{BW_k}{2} + \frac{BW_i}{2} + GB_i + f_{lk}, \ 1 \le i \ne k \le N$$
[Equation 3]
$$f_{li} = \frac{BW_k}{2} + \frac{BW_i}{2} + GB_i + \widetilde{f_{lk}} + f_{ck}, \ i = m$$

When a mid-frequency of a first signal is set to 0 Hz and a mid-frequency of a fourth signal is set to be located next to the first signal, a mid-frequency and a radio frequency of a fourth signal that has a largest bandwidth may be calculated based on Equation 3 and Equation 1.

$$f_{l4} = \frac{BW_1}{2} + \frac{BW_4}{2} + GB + \widetilde{f_{l1}} + f_{c1}$$
$$= 10 + 1000 + 100 + 800 + 800$$
$$= 2710$$

$$\widetilde{f_{l4}} = f_{c4} + f_{l4}$$
$$= 60000 + 2710$$
$$= 62710 \text{ MHz}$$

Mid-frequencies of a second signal and a third signal may be calculated based on Equation 2.

$$f_{l2} = \frac{BW_4}{2} + \frac{BW_2}{2} + GB + f_{l4}$$
$$= 1000 + 2 + 100 + 2710$$
$$= 3812 \text{ MHz}$$

$$\widetilde{f_{l2}} = f_{c2} + f_{l2}$$
$$= 1700 + 3812$$
$$= 5512 \text{ MHz}$$

$$f_{l3} = \frac{BW_2}{2} + \frac{BW_3}{2} + GB + f_{l2}$$
$$= 2 + 50 + 100 + 3812$$
$$= 3964 \text{ MHz}$$

$$\widetilde{f_{l3}} = f_{c3} + f_{l3}$$
$$= 2400 + 3964$$
$$= 6364 \text{ MHz}$$

Each signal $A_i(t)$, $1 \le i \le N$ that is up-converted by the radio frequency processing unit may pass through a BPF corresponding to a corresponding communication and thus, only $\widetilde{A_1}(t), \widetilde{A_2}(t), \widetilde{A_3}(t)$ and $\widetilde{A_4}(t)$ may be outputted.

Figure 16:
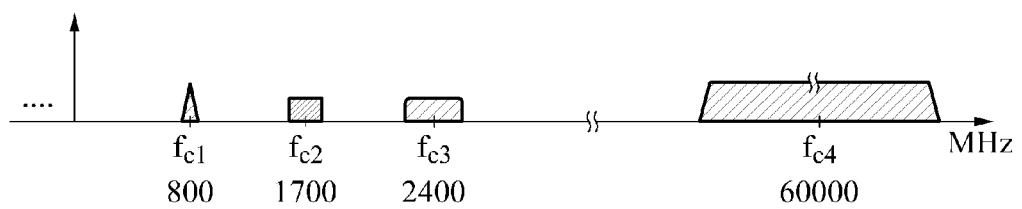
FIG. 16 is a diagram illustrating a multi-mode signal processed by a radio frequency processing unit for each case of FIGS. 13, 14, and 15.

FIG. 16 illustrates a multi-mode signal process by a radio frequency processing unit for each case of FIGS. 13, 14, and 15.

Referring to FIG. 16, respective signals may be positive frequency spectrums with respect to four signals $\widetilde{A_1}(t), \widetilde{A_2}(t), \widetilde{A_3}(t)$ and $\widetilde{A_4}(t)$ transmitted via an antenna. Each signal may be up-converted to a transmission frequency desired by a corresponding communication service.

The method according to the above-described embodiments of the present invention may be recorded in non-transitory computer readable media including program instructions to implement various operations embodied by a computer. The media may also include, alone or in combination with the program instructions, data files, data structures, and the like. The described hardware devices may be configured to act as one or more software modules in order to perform the operations of the above-described embodiments of the present invention, or vice versa.

Although a few embodiments of the present invention have been shown and described, the present invention is not limited to the described embodiments. instead, it would be appreciated by those skilled in the art that changes may be made to these embodiments without departing from the principles and spirit of the invention, the scope of which is defined by the claims and their equivalents.

The invention claimed is:

1. A multi-mode ultra broadband receiving apparatus, the apparatus comprising:
    a radio frequency processing unit to down-convert multiple analog signals to mid-frequencies, and the down-conversion is performed in a range where the multiple analog signals do not cause interference with each other;
    a parallel-to-serial converting unit to convert the down-converted parallel analog signals to a serial analog signal;
    an analog-to-digital converter to convert the serial analog signal to a digital signal;
    a mid-frequency processing unit to down-convert the digital signals to multiple baseband signals; and
    a baseband receiving unit to receive the down-converted multiple baseband signals.

2. A multimode ultra broadband transceiving apparatus, the apparatus comprising:
    a mid-frequency processing unit to up-convert multiple parallel digital signals existing in a baseband to mid-frequencies, and the up-conversion is performed in a range where the multiple parallel digital signals do not cause interference with each other;
    a first parallel-to-serial converter to up-convert, to a serial digital signal, the up-converted parallel digital signals that are up-converted to the mid-frequencies;
    a digital-to-analog converter to convert the serial digital signal to an analog signal;
    a first radio frequency processing unit to up-convert the analog signal to multiple transmission frequencies respectively corresponding to desired communication services;
    a transmission and reception signal separating unit to separate the up-converted analog signal that is up-converted to the multiple transmission frequencies and multiple analog signals received from an outside;
    a second radio frequency processing unit to down-convert the multiple analog signals received from the outside in a range where the multiple analog signals do not cause interference with each other;
    a second parallel-to-serial converter to convert the down-converted parallel analog signals to a serial analog signal; and
    an analog-to-digital converter to convert the serial analog signal to a digital signal,
    wherein the mid-frequency processing unit up-converts each of the multiple parallel digital signals so that each of the up-converted signals have a guard band.

3. The apparatus of claim 2, wherein the transmission and reception signal separating unit separates the up-converted analog signal that is up-converted to the multiple transmission frequencies and the multiple analog signals received from outside, based on a half duplex (HD) communication or a full duplex (FD) communication.

4. A multi-mode ultra broadband receiving method, the method comprising:
    down-converting multiple analog signals to mid-frequencies, and the down-conversion is performed in a range where the multiple analog signals do not cause interference with each other;
    converting the down-converted parallel analog signals to a serial analog signal;
    converting the serial analog signal to a digital signal;
    down-converting the digital signal to multiple baseband signals; and
    receiving the down-converted multiple baseband signals.

* * * * *